US006433332B1

(12) United States Patent
Chin et al.

(10) Patent No.: US 6,433,332 B1
(45) Date of Patent: Aug. 13, 2002

(54) PROTECTIVE ENCAPSULATION FOR A PHOTOTRANSDUCER INCLUDING A SURFACTANT FILM

(75) Inventors: Gerald J. Chin, Brookfield, WI (US); Philip E. Johnson, Worcester; E. Geoffrey Miller, Groton, both of MA (US); Brian J. Hazen, New Boston, NH (US); Gary L. McEachern, Reading, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 119 days.

(21) Appl. No.: 09/669,539

(22) Filed: Sep. 26, 2000

(51) Int. Cl.⁷ .................................................. H01J 5/02
(52) U.S. Cl. ....................................... 250/239; 257/433
(58) Field of Search ................................. 250/239, 216, 250/208.1, 214.1; 257/80–84, 431–435; 438/55, 64

(56) References Cited

U.S. PATENT DOCUMENTS 6,281,430 B1 * 8/2001 Lupo et al. .................. 136/252

* cited by examiner

Primary Examiner—Que T. Le
(74) Attorney, Agent, or Firm—David G. Luettgen; Alexander M. Gerasimow; William R. Walbrun

(57) ABSTRACT

A method of encapsulating a phototransducer comprises mounting the phototransducer on a substrate, depositing a surfactant on the substrate, and depositing an encapsulant on the substrate over the surfactant. The surfactant alters a surface tension of the substrate. The encapsulant forms a protective structure that protects the phototransducer.

21 Claims, 3 Drawing Sheets though often not in the same package). In an industrial control sensor device of this type, light is used as a transducer mechanism, but the sensed parameter is usually considered to be some other parameter, for example, the presence of an object within the field of view of the photoelectric sensor (presence sensor) or the distance of an object from the photoelectric sensor (proximity sensor).

PROTECTIVE ENCAPSULATION FOR A PHOTOTRANSDUCER INCLUDING A SURFACTANT FILM

BACKGROUND OF THE INVENTION

1. Field of the Invention

The present invention relates to a protective encapsulation for a phototransducer.

2. Description of Related Art

Phototransducers are employed in a wide array of applications. Herein, "phototransducer" includes both receiver devices (e.g., photosensitive diodes) which produce an electrical output in response to sensed light as well as transmitter devices (e.g., light emitting diodes) which produce light in response to an electrical input. Herein, "light" includes not only visible light, but also ultraviolet and infrared radiation.

A photoelectric sensor is an example of a device that typically uses one or more phototransducers. Herein, "photoelectric sensor" refers to an industrial control sensor device that comprises at least one receiver-type phototransducer, and typically also a transmitter-type phototransducer (though often not in the same package). In an industrial control sensor device of this type, light is used as a transducer mechanism, but the sensed parameter is usually considered to be some other parameter, for example, the presence of an object within the field of view of the photoelectric sensor (presence sensor) or the distance of an object from the photoelectric sensor (proximity sensor). Different types of photoelectric sensors can operate according to different modes of operation, including transmitted beam sensing modes, retroreflective sensing modes and diffuse sensing modes. For example, in a retroreflective presence sensing mode, the transmitter emits a light beam which is received by the receiver if an object is present to reflect the light beam. When no object is present, the light beam is not reflected and therefore is not received by the receiver. Whether the receiver receives a reflected light beam thus provides an indication whether an object is present. The signal that is thereby generated may then be used for further process control.

Phototransducers are typically wafer fabricated and subsequently mounted on a substrate having first and second electrical traces for connection to the phototransducer. According to this process, one side of the phototransducer is attached to the substrate via a solder pad which is electrically connected to one of the traces, and the opposite side of the phototransducer is electrically connected to the other trace by way of a thin wire bond. A transparent encapsulant (commonly referred to as potting material) is then used to construct a dome-shaped structure that encapsulates and protects the phototransducer and the thin wire bond from pick and place machine handling, shipping shock or vibration, corrosive environments, electrical contract with other conductive elements, and so on.

It is often desirable to have more control over the shape of the dome that is constructed than is otherwise possible through conventional encapsulation techniques. Constraints may be placed on the shape of the dome based on the dimensions of the phototransducer, the dimensions of the wire bond, and/or the dimensions of the structure into which the phototransducer is ultimately incorporated. Because the encapsulant naturally tends to flow into a thin film, particular difficulty is encountered when the dome must be above a certain height in order to adequately encapsulate the phototransducer and the thin wire bond. An improved encapsulation technique for phototransducers is therefore needed.

SUMMARY OF THE INVENTION

According to a first aspect, a preferred embodiment of the invention provides a method of encapsulating a phototransducer comprising mounting the phototransducer on a substrate, depositing a surfactant on the substrate, and depositing an encapsulant on the substrate over the surfactant. The surfactant alters a surface tension of the substrate. The encapsulant forms a protective structure that protects the phototransducer.

According to a second preferred aspect, another preferred embodiment of the invention provides an apparatus comprising a substrate, a phototransducer, and an encapsulant deposit. The substrate has a surface that includes a surfactant film. The phototransducer is mounted on the substrate. The encapsulant deposit that is located on the surfactant film and encapsulates and protects the phototransducer.

According to a third preferred aspect, another preferred embodiment of the invention provides a method of encapsulating a phototransducer that is mounted on a substrate. The method consists essentially of depositing a surfactant on the substrates adjacent the phototransducer, permitting the surfactant to dry, depositing a single generally dome-shaped layer of encapsulant on the phototransducer, and permitting the encapsulant to cure on the substrate.

Other objects, features, and advantages of the present invention will become apparent to those skilled in the art from the following detailed description and accompanying drawings. It should be understood, however, that the detailed description and specific examples, while indicating preferred embodiments of the present invention, are given by way of illustration and not limitation. Many modifications and changes within the scope of the present invention may be made without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which.

DETAILED DESCRIPTION OF THE PREFERRED EMBODIMENT

Figure 1A:
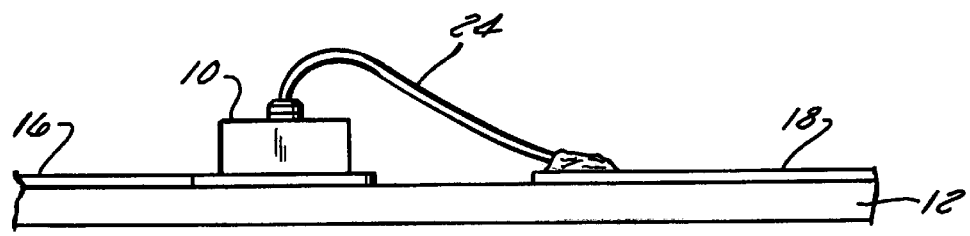
FIGS. 1A–1B are side and plan views, respectively, of a phototransducer mounted on a substrate.
Figure 1B:
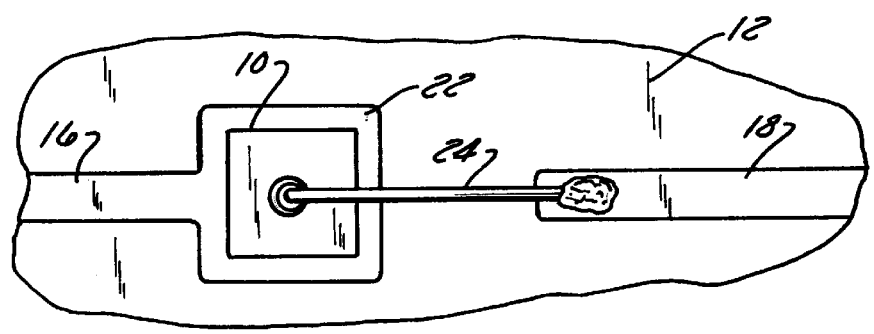
Figure 2A:
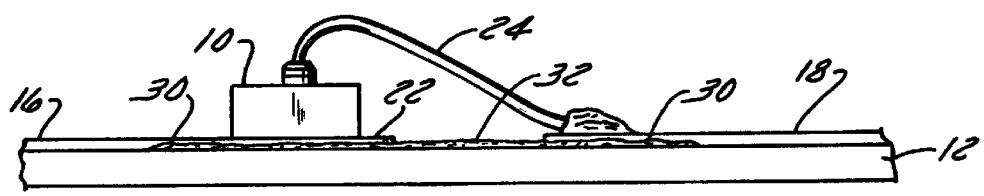
FIGS. 2A–2B are side and plan views, respectively, of the phototransducer and wire bond of FIGS. 1A–1B with a surfactant deposited thereon.
Figure 2B:
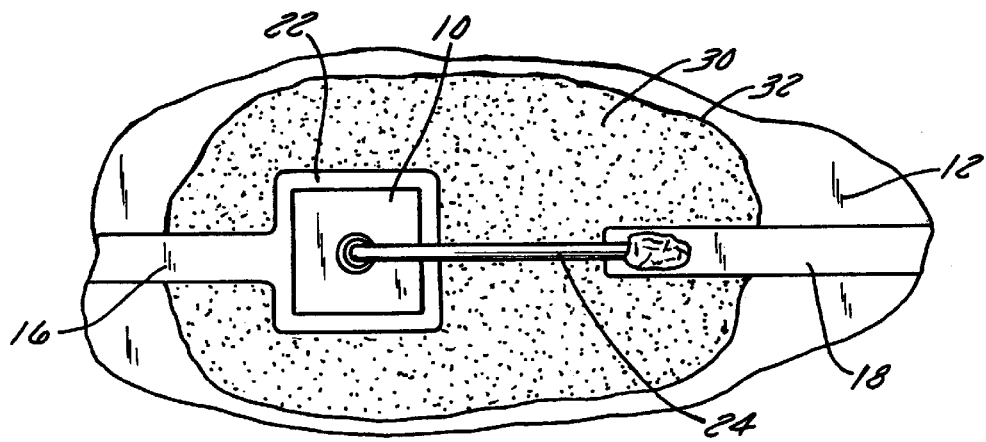
Figure 3A:
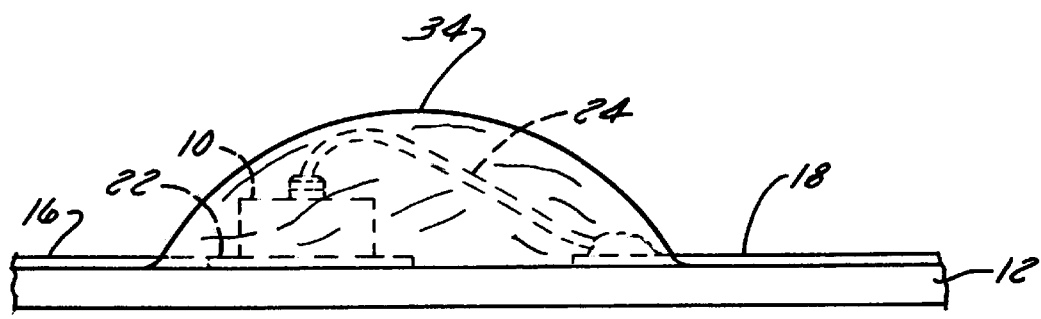
FIGS. 3A–3B are side and plan views, respectively, of the phototransducer of FIGS. 1A–1B contained within a dome-shaped encapsulant structure.
Figure 3B:
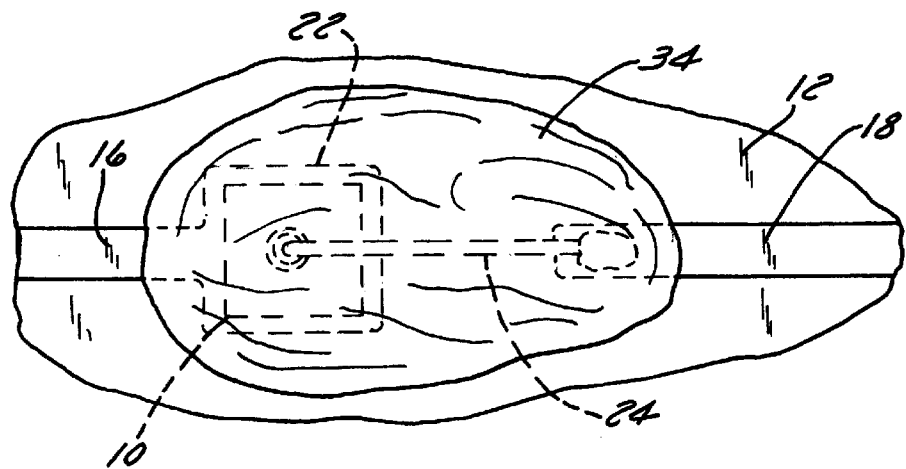

Referring now to FIGS. 1A–1B, 2A–2B, and 3A–3B, various steps of a preferred encapsulation process are shown. By way of overview, according to the preferred encapsulation process, the process begins with the mounting of a phototransducer 10 on a substrate 12, as shown in FIGS. 1A–1B. Then, a surfactant is deposited on the substrate 12, as shown in FIGS. 2A–2B. Finally, an encapsulant is deposited on the substrate 12 to form a protective structure that protects the phototransducer 10, and the encapsulant is then allowed to cure, as shown in FIGS. 3A–3B.

More specifically, referring first to FIGS. 1A–1B, side and plan views, respectively, of the phototransducer 10 mounted on the substrate 12 are shown. As previously noted, the phototransducer 10 may, for example, be a light emitting diode or a photosensitive diode. The substrate 12 may, for example, be a printed circuit board substrate or a ceramic substrate. The substrate 12 includes electrical traces 16 and 18 which are used to establish electrical connections with the phototransducer 10. The trace 16 terminates at a solder pad 22 which provides one electrical connection to the phototransducer 10 and which also serves to mount the phototransducer 10 to the substrate 12. The trace 18 is connected to a wire bond 24 formed of an electrically conductive wire (e.g., a 0.001" gold wire) which establishes the other electrical connection to the phototransducer 10.

Referring next to FIGS. 2A–2B, side and plan views of the substrate 12 coated with a surfactant 30 are shown, respectively. In general, a surfactant is a chemical that alters a surface tension, in this case, of the substrate 12. In the illustrated embodiment, the surfactant 30 reduces the surface tension of the substrate 12. Thus, when the encapsulant is applied (in the next step), the encapsulant has more of a tendency to "bead up" rather than flow into a thin film. Thus, by controlling the surface tension of the substrate, the height of the dome-shaped protective structure can also be controlled.

The surfactant can be manually deposited, for example, by dipping or spraying, or by using a brush, syringe, or other suitable utensil, or the surfactant can be automatically deposited using automatic dispensing equipment. In the present embodiment, the surfactant is manually deposited using a nominally pressurized syringe having a needle which is initially 0.006" in diameter but which is then further compressed with a pliers to form an elliptical opening about 0.003"×0.007". The operator then uses the syringe as a writing utensil to "write" the surfactant onto the surface of the substrate, with the surfactant being dispensed as the operator writes. In this way, surfactant is dispensed on the surface of the substrate in an area 32 adjacent the phototransducer 10, the traces 16 and 18, and the solder pad 22.

A variety of surfactants may be used. Preferably, the surface energy of the dried surfactant film is less than one hundred dyne, and even more preferably between about twelve and thirty dyne (surface tension being equal to surface energy per unit area). In the illustrated embodiment, Fluorad™ fluorochemical coating FC-722 solution is used, available from the Specialty Chemicals Division of 3M, St. Paul, Minn. The surface energy of this surfactant is about twelve dyne.

The surfactant is deposited in liquid form and then permitted to dry to a thin film on the substrate, such that the surface of the substrate now includes the surfactant film. Because the substrate has been modified to include the surfactant film, the surface tension of the surfactant film becomes the surface tension of the substrate, and the surface tension of the substrate is thereby altered by the surfactant.

Referring now to FIGS. 3A–3B, side and plan views of the phototransducer 10, the substrate 12, and the wire bond 24 with the encapsulant deposited thereon is shown. Due to the reduced surface tension of the substrate 12, the encapsulant beads into a generally dome-shaped structure 34 which provides mechanical protection for the phototransducer 10 and the wire bond 24. As shown, the generally dome-shaped structure 34 is not a perfect dome shape but rather is somewhat irregularly shaped due to the manual depositing of the encapsulant and due to the existence of structure (i.e., the phototransducer 10 and the wire bond 24) within the dome-shaped structure 34. The encapsulant is transparent or at least semi-transparent to allow the transmission of light into and out of the dome structure, depending on whether the phototransducer 10 is a receiver or a transmitter. In the illustrated embodiment, the dome-shaped structure 34 has a height of about 0.02" and a diameter of about 0.06". Of course, in practice, the dimensions of the dome-shaped structure 34 are largely dictated by a variety of constraints such as the dimensions of the phototransducer 10, the arrangement of the wire bond 24, and the internal dimensions of the device into which the phototransducer 10 is incorporated.

Again, the encapsulant may be manually or automatically deposited. In the illustrated embodiment, the encapsulant is deposited with a syringe having a needle with a diameter in the range of 0.006" to 0.010". Materials that may be used as the encapsulant include, for example, epoxies, polyurethanes, acrylates, silicones and acrylics, preferably designed for providing protection of components from shock or vibration, corrosive environments and electrical insulation. Preferably, the viscosity of the encapsulant is less than two hundred thousand centi-poise, and even more preferably between one hundred and twenty thousand centi-poise.

The encapsulant is deposited after the surfactant has dried to a thin film, which typically occurs in less than a minute. The encapsulant is then first permitted to cure at ambient or room temperature for approximately twenty-four hours, and then permitted to cure at 130° C. for approximately one hour. It is preferable to permit the encapsulant to first cure at room temperature to prevent the formation of voids in the dome structure caused by surfactant/encapsulant interaction at elevated temperatures. (Although curing at room temperature requires a longer cure time, there is no additional labor required, so any additional cost is minimal. It would also be possible to use shorter cure time at room temperature.) It is preferable to then follow the room temperature cure with the 130° C. cure to raise the glass transition temperature (Tg) of the encapsulant to a maximum level. When the encapsulant has cured, the encapsulation process is complete.

Figure 4:
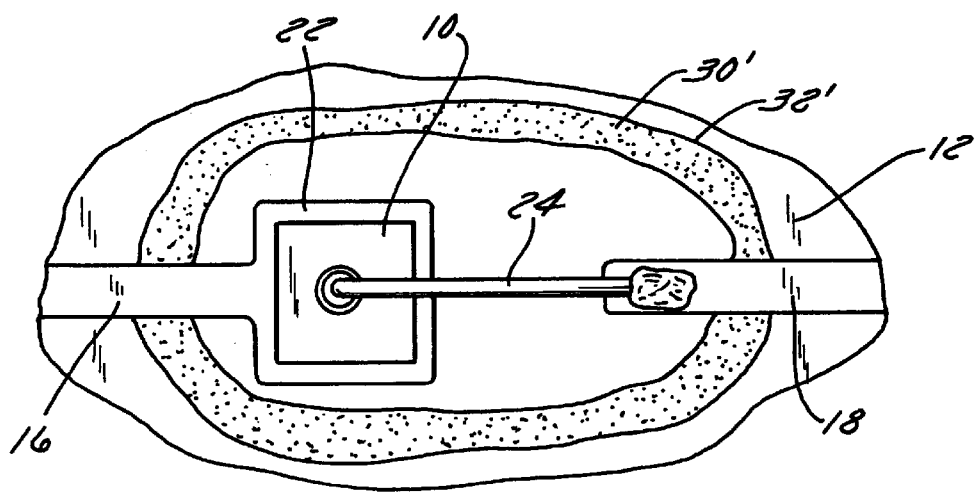
FIG. 4 is a plan view of the phototransducer of FIGS. 1A–1B with a surfactant deposited to form a circular surface tension dam.

FIG. 4 corresponds to FIG. 2B but shows an alternative embodiment in which the surfactant is deposited to form a circular dam. In some instances, it is desirable to have the encapsulant bond directly to the substrate in the area immediately around the phototransducer. This is particularly beneficial where improved mechanical bond strength between the substrate and encapsulant is desired. For these applications, the surfactant may be applied in a circular perimeter region 32' around the phototransducer 10, the traces 16 and 18, and the solder pad 22. The encapsulant may then be deposited on the substrate 12 over the surfactant as well as over the remaining region of the substrate 12 inward of where the surfactant has been applied. The resulting encapsulant deposit, now located on the surfactant film as well as on the remaining inward region of the substrate, bonds directly to the substrate material immediately around the phototransducer 12. In this case, the surfactant acts as a surface tension dam 30' causing the flow of the encapsulant to be slowed and halted as it contacts the surfactant.

The encapsulation technique described above can be used in connection with phototransducers for a wide array of applications. As previously mentioned, a common use of phototransducers is in the field of industrial controls and, in particular, in photoelectric sensors.

Figure 5:
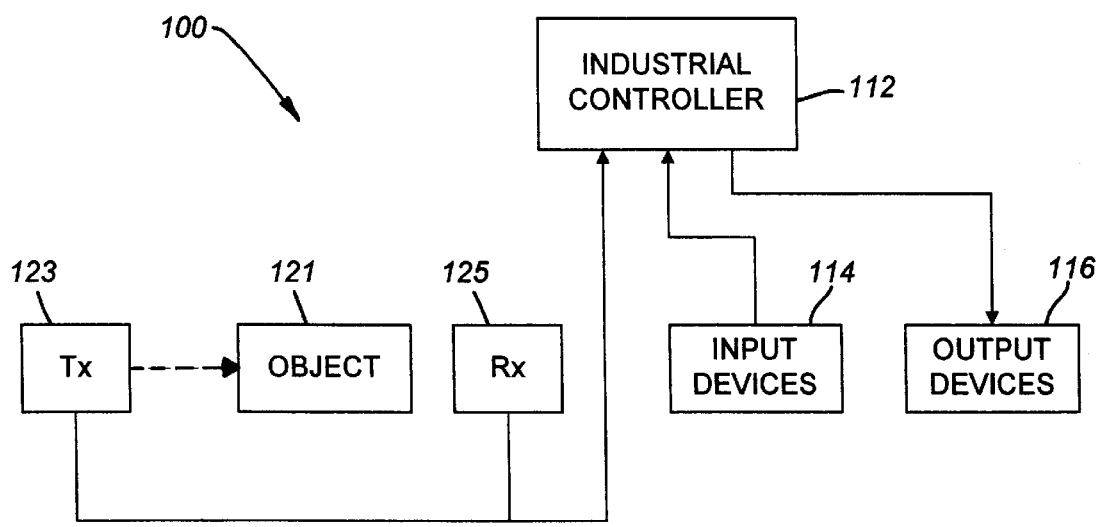
FIG. 5 is a block diagram of an industrial control system having a photoelectric sensor that incorporates the encapsulated phototransducer of FIGS. 3A–3B.

Referring now to FIG. 5, an industrial control system 100 which includes a photoelectric sensor 110 that utilizes one or more phototransducers encapsulated in accordance with the preferred embodiment of the invention is illustrated. The control system 100 includes an industrial controller (e.g., a rack-mounted programmable controller) 112 which examines a plurality of input devices 114 and controls a plurality of output devices 116 based on input status information received from the plurality of input devices 114. The input devices may include, for example, limit switches, pressure and temperature transducers, automatically actuated safety devices, operator input devices such as pushbuttons and switches, and so on, as well as analog input devices. The output devices may include, for example, solenoids, relays, as well as analog output devices.

Among the inputs received by the industrial controller 112 is an input from the photoelectric sensor 110, which may be a presence sensor or a proximity sensor, for example. Assuming the photoelectric sensor 110 is a presence sensor, the photoelectric sensor 110 provides an indication whether an object 121 is present within the field of view of the photoelectric sensor 110. The photoelectric sensor includes a first phototransducer 123 which is a transmitter and a second phototransducer 125 which is a receiver. The transmitter 123 emits a light beam which is received by the receiver 125 if the object 121 is present to reflect the light beam. When no object is present, the light beam is not reflected and, therefore, is not received by the receiver 125. Whether the receiver 125 receives a reflected light beam thus provides an indication whether an object is present, for example, on a conveyor assembly.

The most preferred embodiment of the invention exhibits numerous advantages over conventional encapsulation techniques. The use of a surfactant provides a simple way of achieving a dome-shaped structure of adequate height with a single deposit of encapsulant. The surfactant reduces the tendency of the encapsulant to flow away from the phototransducer. Therefore, it is not necessary to build up the dome using multiple encapsulant coatings, or to use mechanical structure (such as a recessed area or dam) on the substrate to control encapsulant flow. The surfactant coating is easy to apply onto the substrate with simple and commonly available dispensing equipment.

Many other changes and modifications may be made to the present invention without departing from the spirit thereof. The scope of these and other changes will become apparent from the appended claims.

What is claimed is:

1. A method of encapsulating a phototransducer, comprising:
    mounting said phototransducer on a substrate;
    depositing a surfactant on said substrate, said surfactant altering a surface tension of said substrate; and
    depositing an encapsulant on said substrate over said surfactant, said encapsulant forming a protective structure that protects said phototransducer.

2. A method according to claim 1, wherein said surfactant reduces a surface tension of said substrate in a region upon which said encapsulant is deposited.

3. A method according to claim 1, wherein said protective structure is generally dome-shaped.

4. A method according to claim 1, wherein said encapsulant depositing step is performed only once such that said protective structure is formed of a single deposit layer of said encapsulant.

5. A method according to claim 1, wherein said substrate is either a printed circuit board substrate or a ceramic substrate.

6. A method according to claim 1 wherein said surfactant is deposited as a liquid and subsequently dries to a thin film with a surface energy that is in the range of about twelve to thirty dyne.

7. A method according to claim 1, wherein said phototransducer is a light emitting device.

8. A method according to claim 1, wherein said phototransducer is a light-sensitive device.

9. A method according to claim 1, further comprising permitting said encapsulant to cure on said substrate at approximately room temperature for at least one hour.

10. A method according to claim 1, further comprising permitting said encapsulant to cure on said substrate, including
    permitting said encapsulant to cure at approximately room temperature for approximately twenty-four hours, and then
    permitting said encapsulant to cure at approximately 130° C. for approximately one hour.

11. A method according to claim 1, wherein said surfactant is deposited only on a perimeter region around said phototransducer on said substrate, and wherein said encapsulant is deposited both on said substrate over said surfactant and on said substrate in a region inward of said perimeter region.

12. An apparatus comprising:
    a substrate, said substrate having a surface that includes a surfactant film;
    a phototransducer, said phototransducer being mounted on said substrate; and
    an encapsulant deposit that is located on said surfactant film and that encapsulates and protects said phototransducer.

13. An apparatus according to claim 12, wherein said encapsulant deposit is generally dome-shaped.

14. An apparatus according to claim 12, wherein said surfactant film reduces a surface tension of said substrate.

15. An apparatus according to claim 12, wherein said surfactant film is in a perimeter region around said phototransducer, and wherein said encapsulant deposit is located both on said surfactant film and on a region inward of said perimeter region.

16. A method of encapsulating a phototransducer that is mounted on a substrate, consisting essentially of:

depositing a surfactant on said substrate adjacent said phototransducer;

permitting said surfactant to dry;

depositing a single generally dome-shaped layer of encapsulant on said phototransducer; and permitting said encapsulant to cure on said substrate.

17. A method according to claim 16, wherein said encapsulant is permitted to cure at approximately room temperature for at least one hour.

18. A method according to claim 16, wherein said encapsulant is permitted to cure in two steps, including a first curing step in which said encapsulant is permitted to cure at approximately room temperature for approximately twenty-four hours, and a second curing step in which said encapsulant is permitted to cure at approximately 130° C. for approximately one hour.

19. An industrial control system comprising:

(A) a plurality of input devices, at least one of said plurality of input devices comprising a photoelectric sensor, said photoelectric sensor further including
   (1) a substrate, said substrate having a surface that includes a surfactant film,
   (2) a phototransducer, said phototransducer being mounted on said substrate, and
   (3) a generally dome-shaped encapsulant deposit that is located on said surfactant film and that encapsulates and protects said phototransducer;

(B) a plurality of output devices;

(C) a programmable controller, said programmable controller controlling said plurality of output devices based on inputs from said plurality of input devices.

20. An industrial control system according to claim 19, wherein said photoelectric sensor is a proximity sensor.

21. An industrial control system according to claim 19, wherein said photoelectric sensor is a presence sensor.

* * * * *